(12) United States Patent
Anderl et al.

(10) Patent No.: US 10,037,059 B1
(45) Date of Patent: Jul. 31, 2018

(54) MEMORY SLOT FILLER

(71) Applicant: INTERNATIONAL BUSINESS MACHINES CORPORATION, Armonk, NY (US)

(72) Inventors: William J. Anderl, Rochester, MN (US); Cody J. Erie, Adams, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/649,811

(22) Filed: Jul. 14, 2017

(51) Int. Cl.
| H05K 7/00 | (2006.01) |
| H05K 5/00 | (2006.01) |
| G06F 1/18 | (2006.01) |
| G06F 1/20 | (2006.01) |
| H05K 7/20 | (2006.01) |

(52) U.S. Cl.
CPC ............... *G06F 1/181* (2013.01); *G06F 1/20* (2013.01); *H05K 7/20418* (2013.01); *H05K 7/20736* (2013.01)

(58) Field of Classification Search
CPC ........................................................ G06F 1/20
USPC ................................................... 361/679.01
See application file for complete search history.

(56) References Cited

U.S. PATENT DOCUMENTS

| 4,935,845 | A | 6/1990 | Schwehr et al. |
| 5,410,448 | A | 4/1995 | Barker et al. |
| 5,731,633 | A * | 3/1998 | Clayton ................. H01L 23/13 257/668 |
| 6,278,608 | B1 | 8/2001 | Ater et al. |
| 6,285,548 | B1 | 9/2001 | Hamlet et al. |
| 7,403,383 | B2 | 7/2008 | McGuff et al. |
| 7,480,147 | B2 * | 1/2009 | Hoss ........................ G06F 1/20 361/715 |
| 7,788,421 | B1 | 8/2010 | Heath et al. |
| 7,817,430 | B2 | 10/2010 | Sherrod et al. |
| 7,876,559 | B2 | 1/2011 | Shabbir et al. |
| 2007/0263359 | A1 * | 11/2007 | Lai ....................... H01L 23/3672 361/715 |
| 2008/0089034 | A1 * | 4/2008 | Hoss ........................ G06F 1/20 361/721 |
| 2008/0251911 | A1 * | 10/2008 | Farnsworth ......... H01L 23/4093 257/714 |

FOREIGN PATENT DOCUMENTS

| JP | 11145658 A | 5/1999 |
| JP | 2002111255 A | 4/2002 |

OTHER PUBLICATIONS

"Automatic Self-Deforming Air Baffles to Eliminate Air Flow BypassThrough a DIMM Connector" IBM IPCOM000171719D Jun. 17, 2008.
"Automatic Spring-Loaded Air Baffles to Eliminate Air Flow BypassThrough a Dimm Connector" IBM IPCOM000171717D Jun. 17, 2008.
"IP5-09-03 Redirect Air Flow Using Scoops and Guides" IBM IPCOM000031487D Sep. 27, 2004.

* cited by examiner

*Primary Examiner* — Jerry Wu
(74) *Attorney, Agent, or Firm* — Patterson + Sheridan, LLP

(57) ABSTRACT

A memory slot filler for a computer is provided. The slot filler can be used in place of a memory module in a computer system. The slot filler includes at least some exterior dimensions that are smaller than the corresponding exterior dimensions of a memory module.

20 Claims, 7 Drawing Sheets

MEMORY SLOT FILLER

BACKGROUND

The present invention relates to memory slot fillers for computers, and more specifically, to a memory slot filler with at least some exterior dimensions smaller than the corresponding dimensions of a memory module.

Computer systems typically include a motherboard with a plurality of slots for memory modules. Each of these memory module slots can hold a memory module, for example a Dual In-Line Memory Module (DIMM), which can be used to store information for the computer system. In some systems, each memory module slot is filled with a memory module. But in other systems some of the memory module slots are left empty. For example, a computer system might have a motherboard with a maximum memory capacity greater than is necessary for the system to operate. Rather than include unnecessary, and expensive, memory modules to fill every memory module slot, some memory module slots are left empty.

SUMMARY

One embodiment described herein is a computer chassis that includes a motherboard, a first memory port disposed on the motherboard and including a first memory module slot, and a second memory port disposed on the motherboard and including a second memory module slot, where the first and second memory module slots include respective first ends and second ends. The computer chassis includes a cooling fan operable to direct airflow toward the first ends of the first memory module slot and the second memory module slot. The computer chassis includes a memory module inserted in the first memory module slot such that the memory module is communicatively coupled with the first memory port, the memory module including a substrate and a plurality of memory chips mounted on the substrate, where the memory module is defined by a first set of exterior dimensions. The memory module includes a leading edge that protrudes from the first end of the first memory module slot in a first direction by a first dimension, where the leading edge has a second dimension in a second direction, transverse to the first direction. The computer chassis includes a slot filler inserted in the second memory module slot, the slot filler including a memory slot interface configured for insertion into the second memory module slot of the motherboard and a body coupled to the memory slot interface that is defined by a second set of exterior dimensions. The body includes a leading edge rail that protrudes from the first end of the second memory module slot in the first direction by the first dimension, where the leading edge rail has the second dimension in the second direction, and where the second set of exterior dimensions includes a first subset of one or more exterior dimensions matching corresponding exterior dimensions of the first set of exterior dimensions of the memory module, where the first subset includes the first dimension and the second dimension of the leading edge rail. The second set of exterior dimensions includes a second subset of one or more exterior dimensions smaller than corresponding exterior dimensions of the memory module substrate in the first set of exterior dimensions of the memory module.

Another embodiment described herein is a computer memory module slot filler that includes a memory slot interface configured for insertion into a memory module slot disposed on a motherboard. The computer memory module slot filler includes a body coupled to the memory slot interface that is defined by a set of exterior dimensions. The body includes a leading edge rail that protrudes from a first end of the memory module slot in a first direction by a first dimension, where the leading edge rail has a second dimension in a second direction, transverse to the first direction, and where the set of exterior dimensions include a first subset of one or more exterior dimensions matching corresponding exterior dimensions of a memory module inserted in another memory module slot disposed on the motherboard, where the memory module includes a substrate and a plurality of memory chips mounted on the substrate and the memory module is operable to be inserted into a memory module slot of the motherboard such that the memory module is communicatively coupled to the motherboard, where the first subset includes the first dimension and the second dimension of the leading edge rail. The set of exterior dimensions includes a second subset of one or more exterior dimensions that are smaller than corresponding exterior dimensions of the memory module substrate. The slot filler is monolithic and includes one of a plastic material, a polymer material, or a rubber material.

DETAILED DESCRIPTION

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Empty memory module slots are not optimal for cooling. Many computer systems include one or more cooling fans that are used to cool the system components. These cooling fans are typically most effective in cooling the system when every memory module slot is full. Empty memory module slots reduce the effectiveness of the cooling fans and decrease the cooling efficiency of the system. Embodiments herein describe computing systems where slot fillers (e.g., dummy or nonfunctional memory modules) are disposed in otherwise empty slots. In one embodiment, the slot fillers do not have the same form factor or dimensions as a functional memory module. That is, the body of the slot filler may have a first set of exterior dimensions where at least one of those dimensions is smaller than corresponding exterior dimension of a functional memory module.

Figure 1:
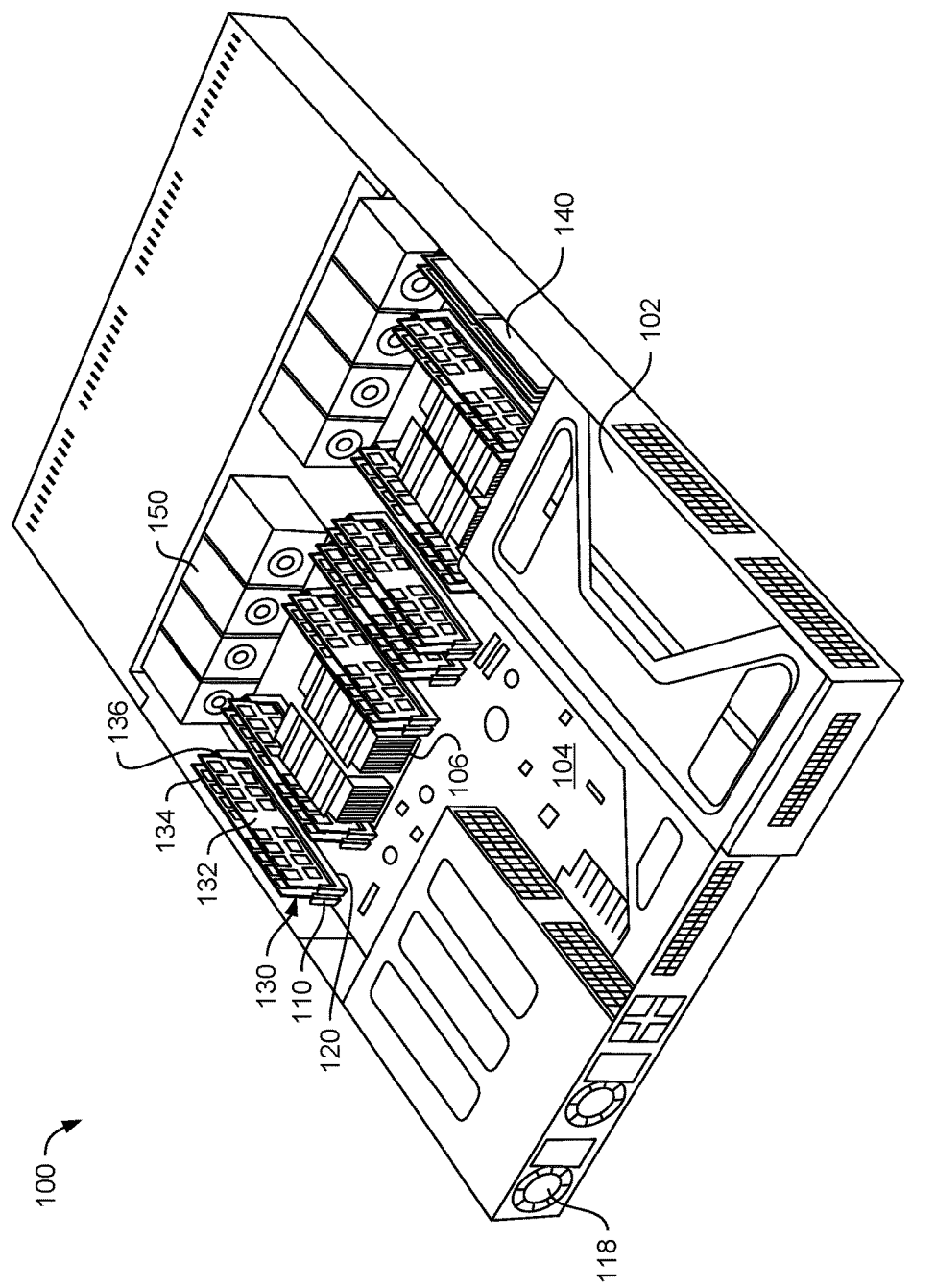
FIG. 1 is a perspective view of a computer system 100.

FIG. 1 illustrates a computer system 100 with a chassis 102. The chassis 102 includes a motherboard 104, a processor 106 and a power supply 108. The motherboard 104 includes a plurality of memory ports disposed upon it, including the memory port 110. The memory port 110 includes a memory module slot 120. The memory module 130 is inserted into the memory module slot 120. The memory module 130 is communicatively coupled with the memory port 110 and the processor 106, such that the memory module 130 can store information used by the computer system. The memory module 130 can be a dual in-line memory module (DIMM), a single in-line memory module (SIMM) or any other memory module suitable for insertion into the memory module slot 120 and for storage of information used by the computer system. The memory module 130 includes a substrate 132 and a plurality of memory chips 134 mounted on the substrate 132.

The memory module 130 includes a leading edge 136 which protrudes from the memory module slot 120 in a first direction perpendicular to the motherboard 104. Leading edge 136 extends across the memory module slot in a second direction parallel to the motherboard. Chassis 102 further includes a plurality of cooling fans 150 oriented to blow air toward the leading edge 136 of a memory module 130. In one embodiment, the leading edge 136 is perpendicular to the direction of the blowing air. The air flow across the memory module 130 serves to cool the memory module during operation.

It has been observed that the cooling fans 150 provide greater cooling efficiency when each memory module slot 120 is connected to a memory module 130, as opposed to when some memory module slots are empty. Empty memory module slots create open space, decreasing proper air flow from the cooling fans 150 and harming cooling efficiency. In general, a turbulent air flow path from the cooling fans 150 across each memory module 130 provides more efficient cooling. But the empty space created by empty memory module slots creates a more laminar, rather than turbulent, air flow from the cooling fans 150 across the memory module 130. This more laminar air flow does not cool the memory module as efficiently as the more turbulent air flow path created when each memory slot contains a memory module.

In one embodiment, cooling is improved if a memory module is disposed in every memory module slot. But this may be undesirable if the additional memory modules are not necessary to store information in the system, because it increases the cost of the system. In another embodiment, a slot filler is disposed in the unused memory slots in place of a memory module. The slot filler 140 illustrates an example slot filler which fills at least a portion of the open space of the empty memory slot, creating a more turbulent air flow across the memory modules and improving cooling efficiency relative to an empty memory slot. The slot filler 140 also protects the memory module slot from dust, debris and accidental contact by a foreign object. In one embodiment, the slot filler 140 is monolithic and made of a plastic material, a polymer material, a rubber material, or another suitable material. This allows the slot filler to be made more cheaply than a memory module and allows the slot filler to be lighter than a memory module, reducing the cost of the computer system and reducing shipping cost if the system is transported.

To improve cooling, the slot filler 140 can be sized to match the dimensions of a memory module. However, as shown in FIG. 1, the slot filler 140 can also be sized so that at least some dimensions are smaller than the corresponding dimensions of the memory module 130. For example, the leading edge of the slot filler 140 can have the same dimensions as the memory module leading edge 136, but other parts of the slot filler can be smaller in dimension than the corresponding parts of a memory module. Such a slot filler uses less material while, as described in more detail with reference to FIG. 7 herein, maintaining similar benefits to, and even improving upon, a slot filler sized to match the dimensions of a memory module. For example, including one or more vacant areas in the slot filler 140 can increase the cooling benefits provided by the slot filler by increasing air flow turbulence from the cooling fans 150. This is particularly true in computer systems in which the memory module slots have a relatively wide pitch, because a slot filler sized to match the dimensions of a memory module tends to be less effective in such systems. A slot filler 140 sized so that at least some dimensions are smaller than the corresponding dimensions of the memory module 130 also uses less material, allowing the slot filler 140 to be even cheaper and lighter than a slot filler matching the dimensions of a memory module. As used herein, smaller in dimension includes a vacant area with dimensions of 0. A portion of a slot filler that is vacant is smaller in dimension than a corresponding part of a memory module that includes material.

Figure 2:
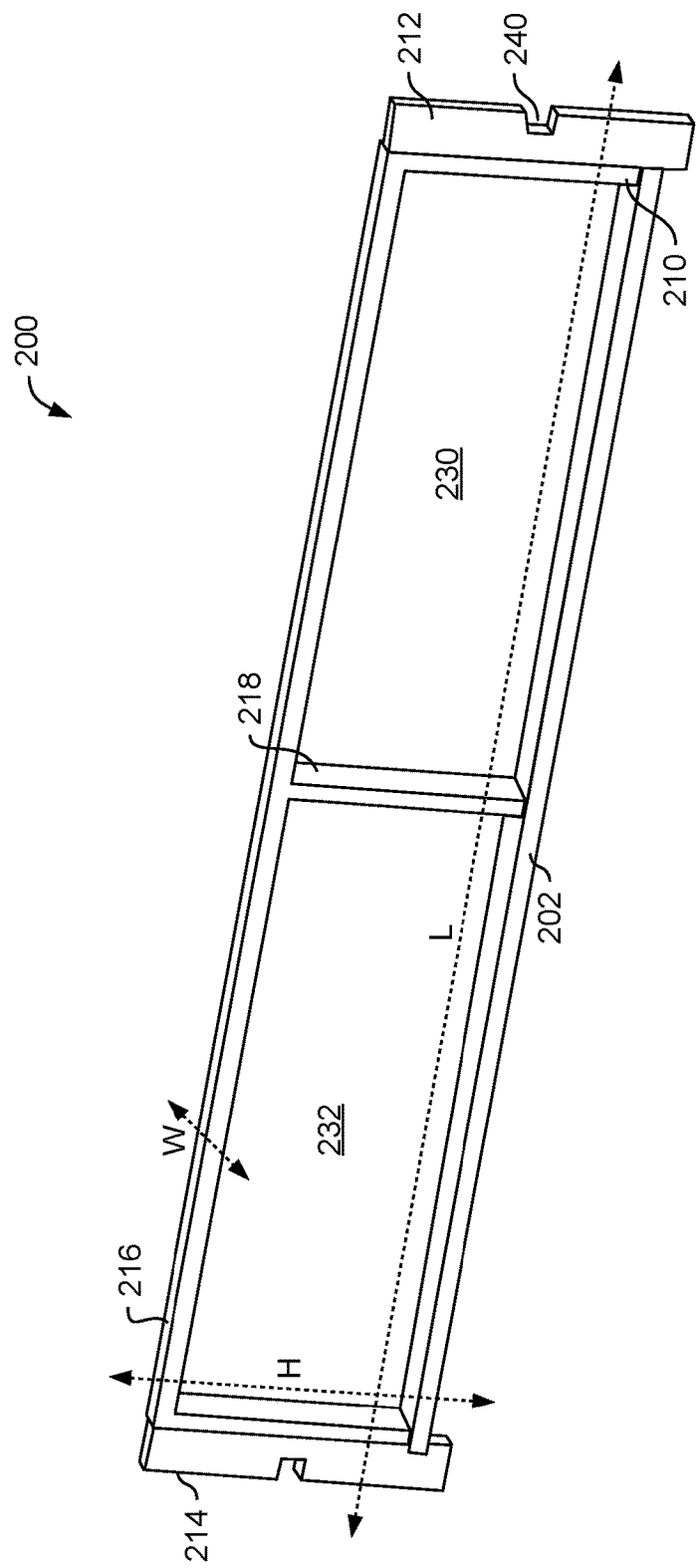
FIG. 2 is a side view of a slot filler 200 according to one embodiment.

FIG. 2 illustrates an example slot filler 200, an embodiment of the slot filler 140. The slot filler 200 includes a memory slot interface 202, configured for insertion into a memory module slot of a motherboard, for example the memory module slot 120 of FIG. 1. The slot filler 200 further includes a body 210 coupled to the memory slot interface 202. The body 210 includes a leading edge rail 212, a trailing edge rail 214, a top rail 216, and a middle rail 218. The slot filler 200 can be placed into a memory module slot such that the leading edge rail 212 is placed nearest to a cooling fan, while the trailing edge rail 214 is placed furthest from a cooling fan.

The leading edge rail 212 can be sized such that it has approximately the same dimensions as the corresponding portion of a memory module, or so that it has smaller (or larger) dimensions than the corresponding portion of the memory module. As illustrated in FIG. 2, the leading edge rail 212 has a height H, a length L, and a width W. According to an embodiment, the height of leading edge rail 212 may be approximately the same as the corresponding height of a memory module. The width, however, can be the same as the corresponding width of a memory module, or it can be different. In general, a larger width will create more air flow turbulence from the cooling fans. The trailing edge rail 214, the top rail 216 and the middle rail 218 can each also be sized to have approximately the same dimensions as the corresponding portion of a memory module, or to have different dimensions than the corresponding portion of the memory module.

A region 230 of the slot filler 200 is bounded by the leading edge rail 212, the middle rail 218, the memory slot interface 202 and the top rail 216. A region 232 of the slot filler 200 is bounded by the middle rail 218, the trailing edge rail 214, the memory slot interface 202 and the top rail 216. According to an embodiment, one or more of the regions 230 and 232 can be void of material, so that the width of the regions is 0. In another embodiment, the regions 230 and 232 can comprise a material that is thinner than the corresponding region on a memory module, so that the width of these regions is smaller than the width of the corresponding regions on a memory module. In both examples, the dimensions of the regions 230 and 232 are smaller than the corresponding dimensions of a memory module because the width of the regions 230 and 232 is smaller than the corresponding width of the memory module.

A slot filler with the regions 230 and 232 void of material can achieve a significant reduction in material as compared to a slot filler matching the dimensions of a memory module. Further, leaving the regions 230 and 232 void of material and including the middle rail 218 can achieve substantially the same, or even increase, the air flow turbulence across the slot filler 200, as compared to a solid slot filler with dimensions matching the corresponding dimensions of a memory module. By including, or leaving out, the top rail 216 and the middle rail 218, a person of ordinary skill in the art can balance the desired cooling efficiency with the cost of the memory filler. In general, depending on the configuration of the computer system, including a top rail 216 and a middle rail 218 will create more air flow turbulence from the cooling fans. But including these components will typically increase the cost and weight of the memory filler, increasing the cost of the computer system. In addition, the slot filler 200 can include one or more surface discontinuities, like the notch 240. These surface discontinuities can further increase the turbulence of the air flow across the slot filler.

Figure 3:
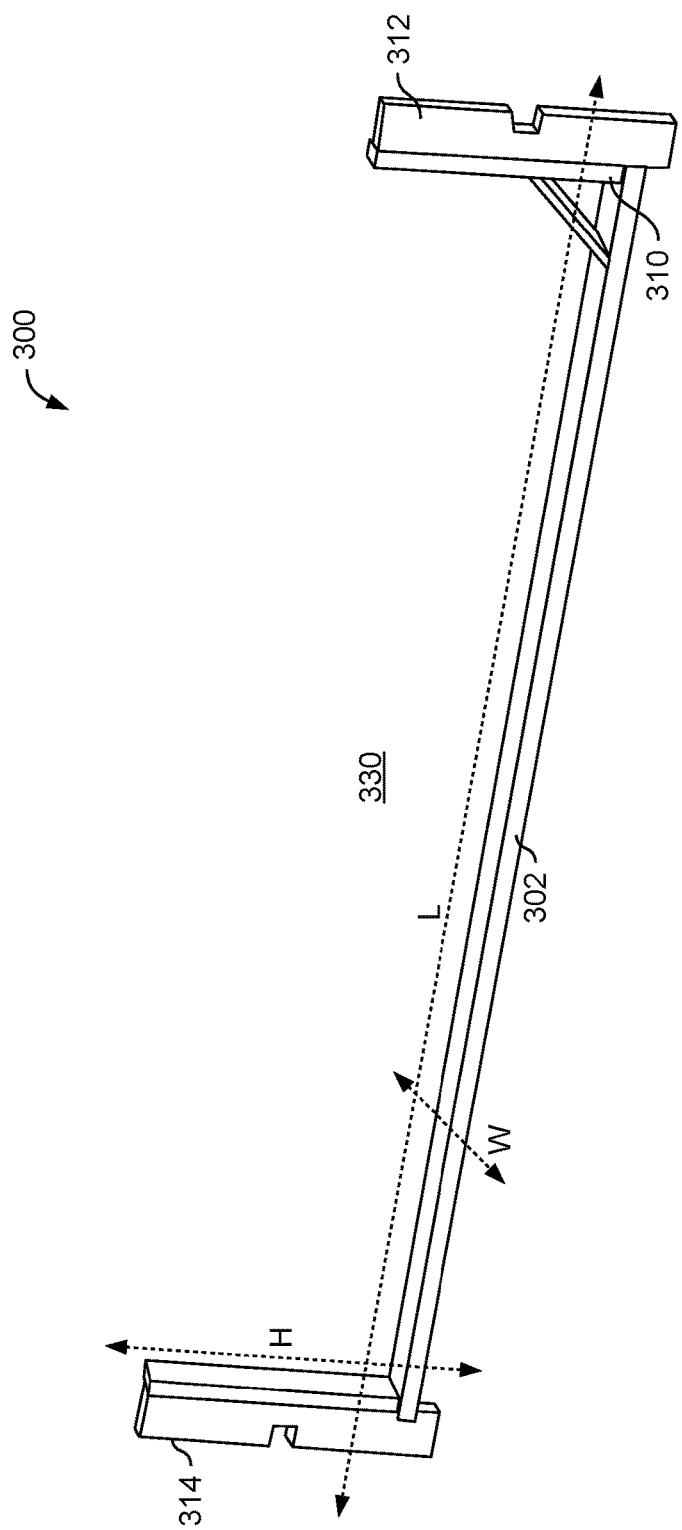
FIG. 3 is a side view of a slot filler 300 according to a second embodiment.

FIG. 3 illustrates a slot filler 300, an embodiment of the slot filler 140. The slot filler 300 includes a memory slot interface 302, configured for insertion into a memory module slot of a motherboard, for example the memory module slot 120 of FIG. 1. The slot filler 300 further includes a body 310 coupled to the memory slot interface 302. The body 310 includes a leading edge rail 312 and a trailing edge rail 314.

The leading edge rail 312 can be sized such that it has approximately the same dimensions as the corresponding portion of a memory module, or so that it has smaller (or larger) dimensions than the corresponding portion of the memory module. As illustrated in FIG. 3, the leading edge rail 312 has a height H, a length L, and a width W. According to an embodiment, the height of leading edge rail 312 may be approximately the same as the corresponding height of a memory module. The width, however, can be the same as the corresponding width of a memory module, or it can be different. In general, a larger width will create more air flow turbulence from the cooling fans. The trailing edge rail 314 can also be sized to have approximately the same dimensions as the corresponding portion of a memory module, or to have different dimensions than the corresponding portion of the memory module.

A region 330 of the slot filler 140 is bounded on three sides by the leading edge rail 312, the trailing edge rail 314, and the memory slot interface 302. As shown, the region 330 can be void of material, so that the width of the region is 0. In another embodiment, the region 330 can comprise a material that is thinner than the corresponding region on a memory module, so that the width of the region is smaller than the width of the corresponding region on a memory module. In both examples, the dimensions of the region 330 are smaller than the corresponding dimensions of a memory module because the width of the region 330 is smaller than the corresponding width of the memory module.

A slot filler with the region 330 void of material can achieve a significant reduction in material as compared to a slot filler matching the dimensions of a memory module. The slot filler 300 will, in general and depending on the configuration of the computer system into which the slot filler is inserted, create less air flow turbulence from the cooling fans than the slot filler 200 because it does not include a top rail 216 or middle rail 218. But the slot filler 300 uses less material, and so will generally be cheaper and lighter than the slot filler 200. A person of ordinary skill in the art can choose the optimal configuration for a given computer system.

Figure 4:
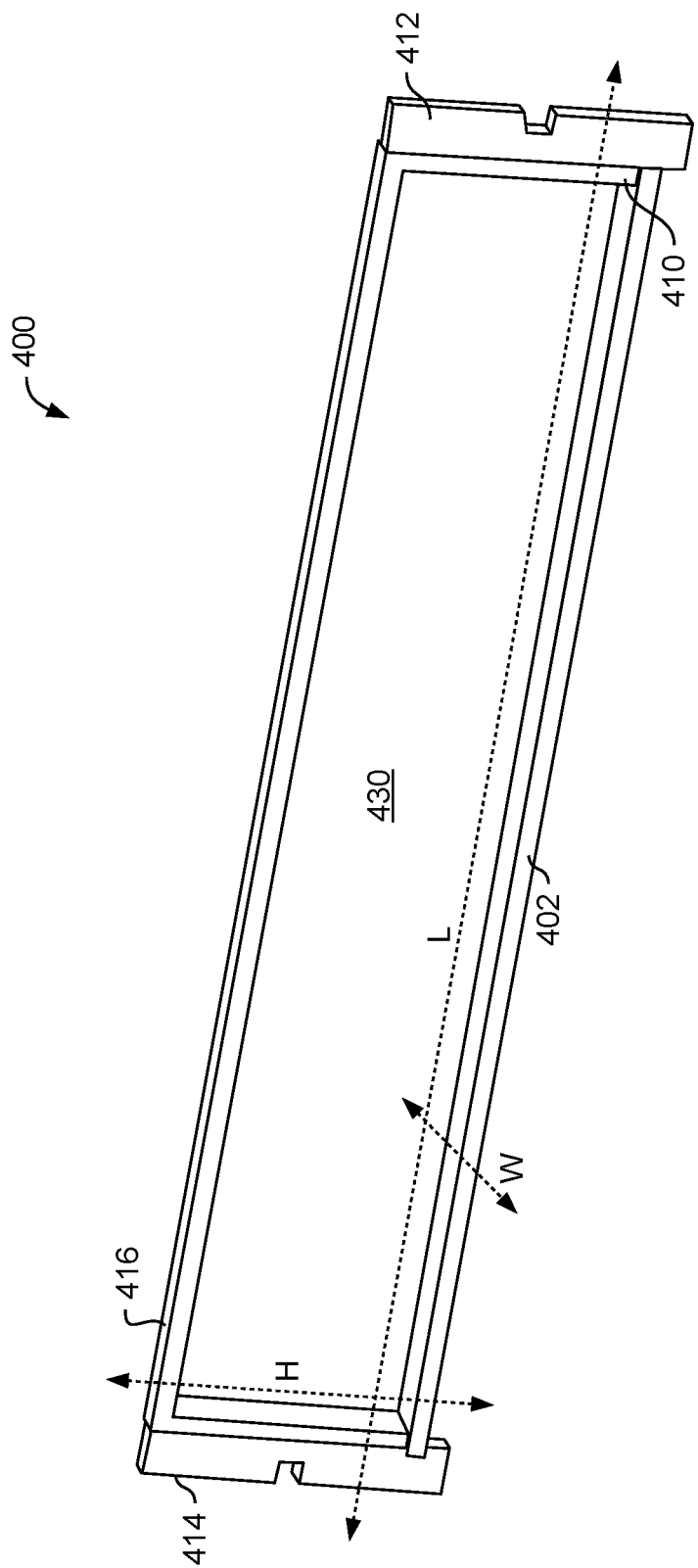
FIG. 4 is a side view of a slot filler 400 according to a third embodiment.

FIG. 4 illustrates a slot filler 400, an embodiment of slot filler 140. The slot filler 400 includes a memory slot interface 402, configured for insertion into a memory module slot of a motherboard, for example the memory module slot 120 of FIG. 1. The slot filler 400 further includes a body 410 coupled to the memory slot interface 402. The body 410 includes a leading edge rail 412, a trailing edge rail 414, and a top rail 416.

The leading edge rail 412 can be sized such that it has approximately the same dimensions as the corresponding portion of a memory module, or so that it has smaller (or larger) dimensions than the corresponding portion of the memory module. As illustrated in FIG. 4, the leading edge rail 412 has a height H, a length L, and a width W. According to an embodiment, the height of leading edge rail 412 may be approximately the same as the corresponding height of a memory module. The width, however, can be the same as the corresponding width of a memory module, or it can be different. In general, a larger width will create more air flow turbulence from the cooling fans. The trailing edge rail 414 and the top rail 416 can each also be sized to have approximately the same dimensions as the corresponding portion of a memory module, or to have different dimensions than the corresponding portion of the memory module.

A region 430 of the slot filler 400 is bounded by the leading edge rail 412, the trailing edge rail 414, the memory slot interface 402, and the top rail 416. As shown, the region 430 can be void of material, so that the width of the region is 0. In another embodiment, the region 430 can comprise a material that is thinner than the corresponding region on a memory module, so that the width of the region is smaller than the width of the corresponding region on a memory module. In both examples, the dimensions of the regions 430 are smaller than the corresponding dimensions of a memory module because the width of the region 430 is smaller than the corresponding width of the memory module.

A slot filler with the region 430 void of material can achieve a significant reduction in material as compared to a slot filler matching the dimensions of a memory module. The slot filler 400 will, in general and depending on the configuration of the computer system into which the slot filler is inserted, create less air flow turbulence from the cooling fans than the slot filler 200 because the slot filler 400 does not include the middle rail 218. But the slot filler 400 will, again in general and depending on the configuration of the computer system into which the slot filler is inserted, create more air flow turbulence than the slot filler 300 because the slot filler 400 includes top rail 416. A person of ordinary skill in the art can choose the optimal configuration for a given computer system.

Figure 5:
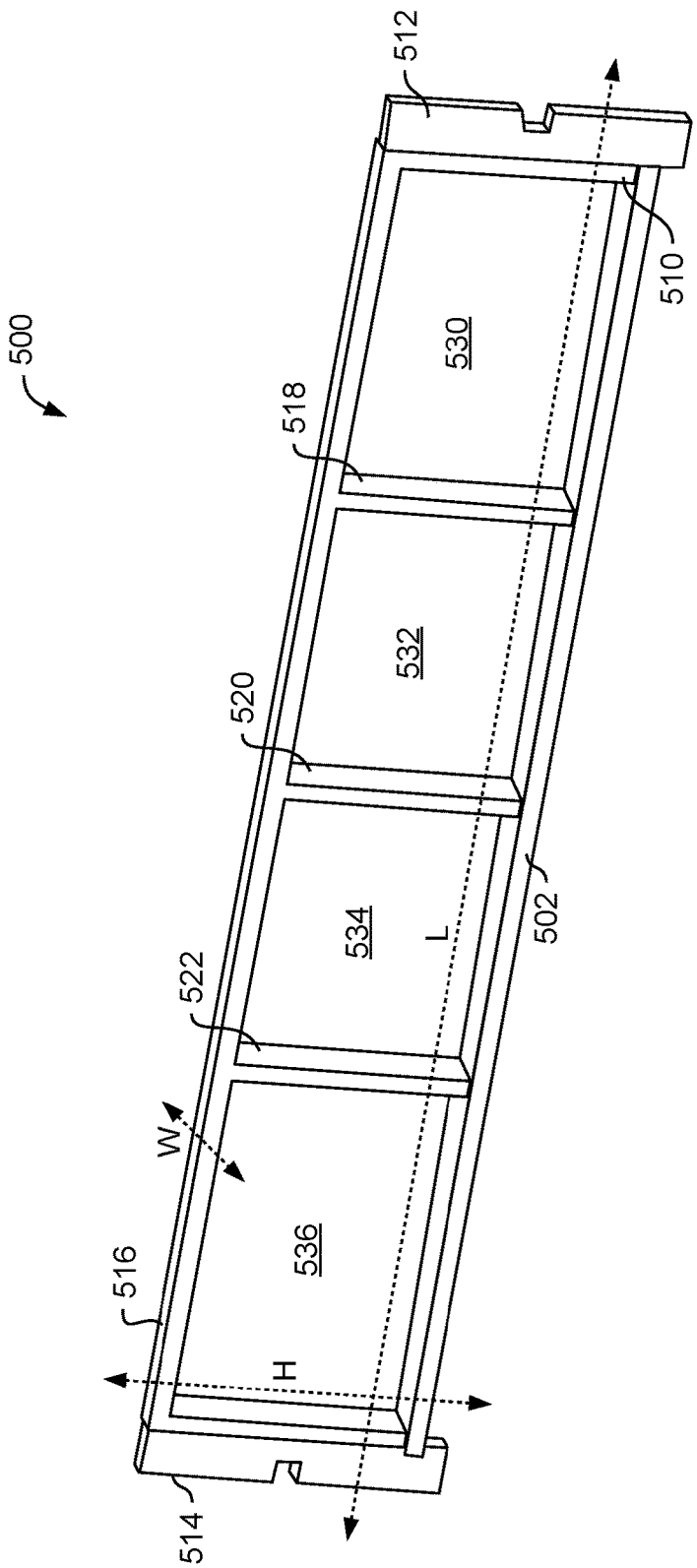
FIG. 5 is a side view of a slot filler 500 according to a fourth embodiment.

FIG. 5 illustrates a slot filler 500, an embodiment of the slot filler 140. The slot filler 500 includes a memory slot interface 502, configured for insertion into a memory module slot of a motherboard, for example the memory module slot 120 of FIG. 1. The slot filler 500 further includes a body 510, coupled to the memory slot interface 502. The body 510 includes a leading edge rail 512, a trailing edge rail 514, a top rail 516, and a plurality of middle rails 518, 520 and 522.

The leading edge rail 512 can be sized such that it has approximately the same dimensions as the corresponding portion of a memory module, or so that it has smaller (or larger) dimensions than the corresponding portion of the memory module. As illustrated in FIG. 5, the leading edge rail 512 has a height H, a length L, and a width W. According to an embodiment, the height of leading edge rail 512 may be approximately the same as the corresponding height of a memory module. The width, however, can be the same as the corresponding width of a memory module, or it can be different. In general, a larger width will create more air flow turbulence from the cooling fans. The trailing edge rail 514, the top rail 516, and the middle rails 518, 520, and 522 can each also be sized to have approximately the same dimensions as the corresponding portion of a memory module, or to have different dimensions than the corresponding portion of the memory module.

A region 530 of the slot filler 500 is bounded by the leading edge rail 512, the middle rail 518, the memory slot interface 502 and the top rail 516. A region 532 of the slot filler 500 is bounded by the middle rails 518 and 520, the memory slot interface 502 and the top rail 516. A region 534 of the slot filler 500 is bounded by the middle rails 520 and 522, the memory slot interface 502 and the top rail 516. A region 536 of the slot filler 500 is bounded by the middle rail 522, the trailing edge rail 514, the memory slot interface 502 and the top rail 516. According to an embodiment, one or more of the regions 530, 532, 534, and 536 can be void of material, so that the width of the regions is 0. In another embodiment, the regions 530, 532, 534, and 536 can comprise a material that is thinner than the corresponding region on a memory module, so that the width of these regions is smaller than the width of the corresponding regions on a memory module. In both examples, the dimensions of the regions 530, 532, 534, and 536 are smaller than the corresponding dimensions of a memory module because the width of the regions 530, 532, 534, and 536 is smaller than the corresponding width of the memory module.

A slot filler with the regions 530, 532, 534, and 536 void of material can achieve a significant reduction in material as compared to a slot filler matching the dimensions of a memory module. Depending on the configuration of the computer system into which the slot filler 500 is inserted, the inclusion of the plurality of middle rails 518, 520, and 522 may create more air flow turbulence than the slot filler 200 with a single middle rail 218. But the slot filler 500 uses more material than the slot filler 200 and will therefore, typically, be more expensive and heavier. A person of ordinary skill in the art can choose the optimal slot filler for a given computer system.

Figure 6:
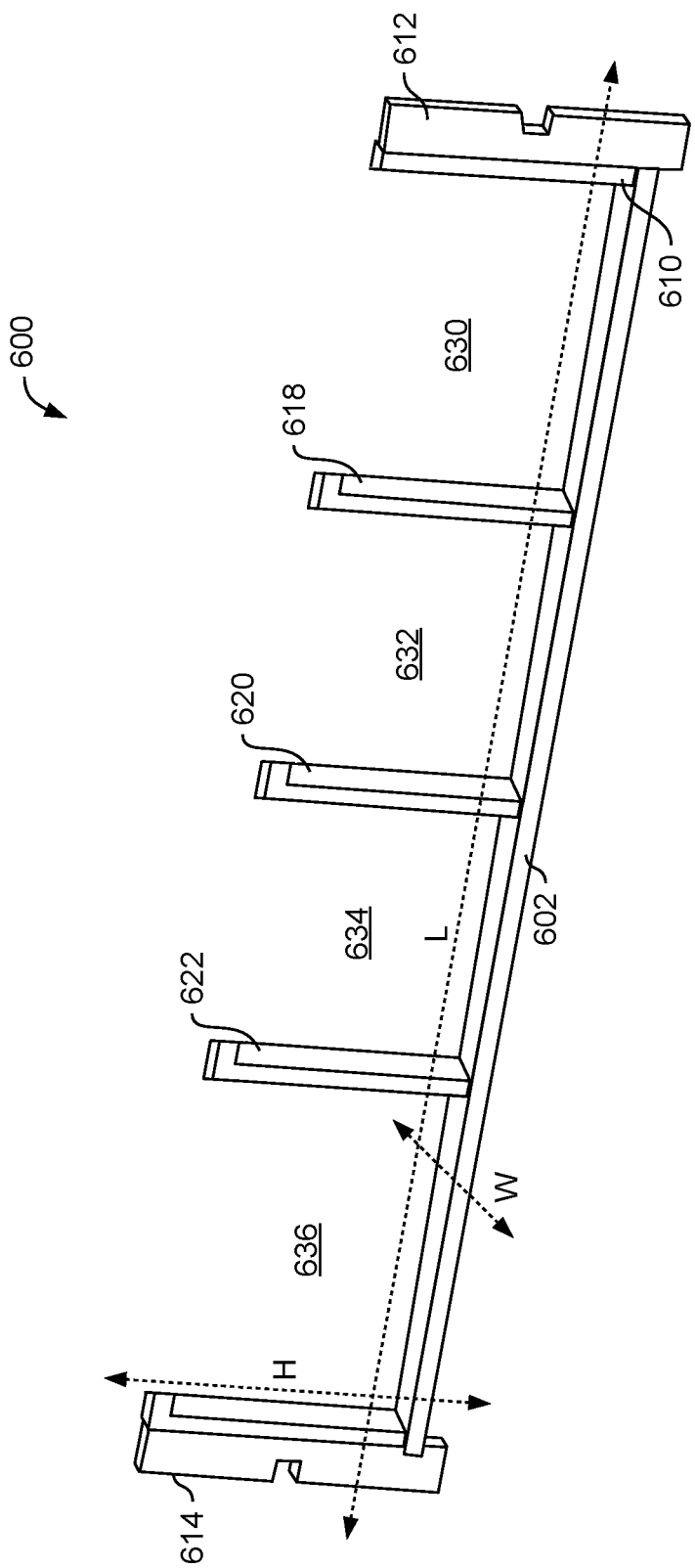
FIG. 6 is a side view of a slot filler 600 according to a fifth embodiment.

FIG. 6 illustrates a slot filler 600, an embodiment of slot filler 140. The slot filler 600 includes a memory slot interface 602, configured for insertion into a memory module slot of a motherboard, for example the memory module slot 120 of FIG. 1. The slot filler 600 further includes a body 610, coupled to the memory slot interface 602. The body 610 includes a leading edge rail 612, a trailing edge rail 614 and a plurality of middle rails 618, 620 and 622.

The leading edge rail 612 can be sized such that it has approximately the same dimensions as the corresponding portion of a memory module, or so that it has smaller (or larger) dimensions than the corresponding portion of the memory module. As illustrated in FIG. 6, the leading edge rail 612 has a height H, a length L, and a width W. According to an embodiment, the height of leading edge rail 612 may be approximately the same as the corresponding height of a memory module. The width, however, can be the same as the corresponding width of a memory module, or it can be different. In general, a larger width will create more air flow turbulence from the cooling fans. The trailing edge rail 614 and the middle rails 618, 620, and 622 can each also be sized to have approximately the same dimensions as the corresponding portion of a memory module, or to have different dimensions than the corresponding portion of the memory module.

A region 630 of the slot filler 600 is bounded on three sides by the leading edge rail 612, the middle rail 618 and the memory slot interface 602. A region 632 of the slot filler 600 is bounded on three sides by the middle rails 618 and 620 and the memory slot interface 602. A region 634 of the slot filler 600 is bounded on three sides by the middle rails 620 and 622 and the memory slot interface 602. A region 636 of the slot filler 600 is bounded on three sides by the middle rail 622, the trailing edge rail 614 and the memory slot interface 602. According to an embodiment, one or more of the regions 630, 632, 634, and 636 can be void of material, so that the width of the regions is 0. In another embodiment, the regions 630, 632, 634, and 636 can comprise a material that is thinner than the corresponding region on a memory module, so that the width of these regions is smaller than the width of the corresponding regions on a memory module. In both examples, the dimensions of the regions 630, 632, 634, and 636 are smaller than the corresponding dimensions of a memory module because the width of the regions 630, 632, 634, and 636 is smaller than the corresponding width of the memory module.

A slot filler with the regions 630, 632, 634, and 636 void of material can achieve a significant reduction in material as compared to a slot filler matching the dimensions of a memory module. Depending on the configuration of the computer system into which the slot filler 600 is inserted, the slot filler 600 may create less air flow turbulence than the slot filler 500 because the slot filler 600 does not include the top rail 516. But the slot filler 600 uses less material than the slot filler 500 and so will, typically, be lighter and cheaper. A person of ordinary skill in the art can choose the optimal slot filler for a given computer system.

Figure 7:
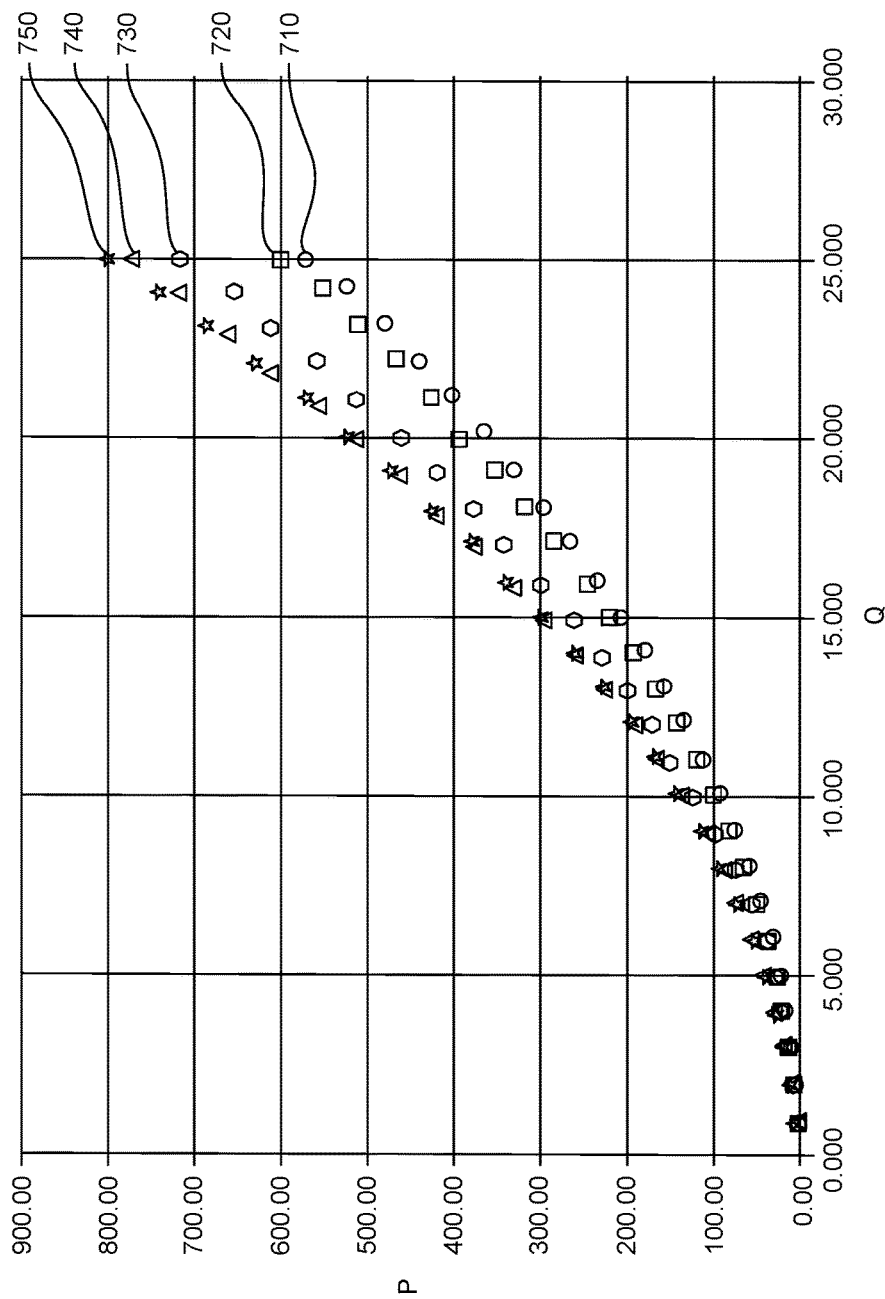
FIG. 7 is a graph illustrating the pressure drop across different slot filler configurations for a given air flow rate.

FIG. 7 is an illustration of the pressure drop across five particular slot filler configurations. As illustrated in FIG. 7, and discussed herein, a slot filler can be designed so that its structure affects the pressure drop across the slot filler for a given airflow rate. To achieve optimal cooling from the cooling fans, the pressure drop should be controlled to create the desired level of turbulent air flow across the memory modules while maintaining a balanced cooling air flow throughout the computer system. A pressure drop that is too high, or too low, can decrease the cooling efficiency from the cooling fans over both the memory module and any other computer components downstream from the memory module. Thus, the slot filler structures disclosed herein provide several design options and allow a person of ordinary skill to choose the structure that provides the desired pressure drop for a given computer system.

The horizontal axis of FIG. 7 represents Q, the airflow rate across a memory module or slot filler, in cubic feet per minute. Q can be described by Equation (1):

$$Q = CA_2\sqrt{2(P_1 - P_2)/\rho} \quad (1)$$

wherein C is a coefficient relating to the hydraulic diameter, $A_2$ is the area of the gap between a memory module or slot filler and the adjacent memory module or slot filler, $P_1$ is the upstream air pressure, $P_2$ is the downstream air pressure and p is the air density.

The vertical axis of FIG. 7 represents ΔP, the pressure drop across a memory module or slot filler in Pascals. ΔP can be described by Equation (2):

$$\Delta P = (P_1 - P_2) = \frac{\rho}{2}\left(\frac{Q}{CA_2}\right)^2 \quad (2)$$

As can be seen from Equation (2), the pressure drop ΔP depends on the airflow rate Q, the air density ρ, the hydraulic diameter coefficient C, and the area of the gap between memory modules or slot fillers $A_2$.

Each symbol in FIG. 7 represents the air flow and pressure drop through a set of four slot fillers, the different symbols in the graph representing different slot filler configurations. The circles 710 represent a solid slot filler. The squares 720 represent a slot filler with a leading edge rail, a trailing edge rail, a bottom memory slot interface, a top rail, and a plurality of middle rails, with the regions between the rails vacant. The hexagons 730 represent a slot filler with a leading edge rail, a trailing edge rail, a bottom memory slot interface, a top rail, and fewer middle rails than the configuration described by squares 720, with the regions between the rails vacant. The triangles 740 represent a slot filler with a leading edge rail, a trailing edge rail, a bottom memory slot interface, a top rail, and fewer middle rails than the configuration described by hexagons 730, again with the regions between the rails vacant. The stars 750 represent an open slot filler with a leading edge rail, a trailing edge rail, a memory slot interface along the bottom and a top rail. The region between the rails is vacant. This configuration is illustrated in FIG. 4 herein.

As can be seen in FIG. 7, use of the open slot filler 750 results in a pressure drop of approximately 800 Pascals at an air flow rate of 25 cubic feet per minute. By comparison, use of the solid slot filler 710 results in a pressure drop of less than 600 Pascals at the same air flow rate. The slot fillers 720, 730, and 740, with varying numbers of middle rails, each result in a pressure drop between 600 and 800 Pascals at that same air flow rate. The preferred pressure drop across a memory module to achieve optimal cooling can vary based on the configuration of the computer chassis, the pitch of the memory module slots, the fan speed, the downstream components after the memory modules and other factors. The varying slot filler configurations described herein allow a person of ordinary skill in the art to choose a desired structure that will achieve a preferred pressure drop while minimizing the amount of material that must be used in the slot filler.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing is directed to embodiments of the present invention, other and further embodiments of the invention may be devised without departing from the basic scope thereof, and the scope thereof is determined by the claims that follow.

What is claimed is:

1. A computer chassis, comprising:
   a motherboard;
   a first memory port disposed on the motherboard and including a first memory module slot;
   a second memory port disposed on the motherboard and including a second memory module slot, wherein the first and second memory module slots include respective first ends and second ends;
   a cooling fan operable to direct airflow toward the first ends of the first memory module slot and the second memory module slot respectively;
   a memory module inserted in the first memory module slot such that the memory module is communicatively coupled with the first memory port, the memory module comprising a substrate and a plurality of memory chips mounted on the substrate, wherein the memory module is defined by a first set of exterior dimensions, the memory module including a leading edge that protrudes from the first end of the first memory module slot in a first direction by a first dimension, and wherein the leading edge has a second dimension in a second direction, transverse to the first direction; and
   a slot filler inserted in the second memory module slot, the slot filler comprising:
      a memory slot interface configured for insertion into the second memory module slot of the motherboard; and
      a body coupled to the memory slot interface and that is defined by a second set of exterior dimensions, the body comprising a leading edge rail that protrudes from the first end of the second memory module slot in the first direction by the first dimension and wherein the leading edge rail has the second dimension in the second direction, and wherein the second set of exterior dimensions includes:
         a first subset of one or more exterior dimensions matching corresponding exterior dimensions of the first set of exterior dimensions of the memory module, wherein the first subset includes the first dimension and the second dimension of the leading edge rail; and
         a second subset of one or more exterior dimensions smaller than corresponding exterior dimensions of the memory module substrate in the first set of exterior dimensions of the memory module.

2. The computer chassis of claim 1, wherein the slot filler is monolithic and comprises one of a plastic material, a polymer material, or a rubber material.

3. The computer chassis of claim 1, wherein the slot filler further comprises a trailing edge rail that protrudes from the second end of the second memory module slot in the first direction, wherein at least a portion of a region between the leading edge and the trailing edge of the slot filler is void of material.

4. The computer chassis of claim 3, wherein the slot filler further comprises a top rail extending between the leading edge and trailing edge.

5. The computer chassis of claim 4, wherein the slot filler further comprises a middle rail that protrudes from the memory slot interface to the top rail at a location between the leading edge rail and the trailing edge rail.

6. The computer chassis of claim 5 wherein each middle rail is located equidistant between the leading edge rail, the trailing edge rail and any other middle rail.

7. The computer chassis of claim 5, wherein the slot filler comprises at least two of the middle rails.

8. The computer chassis of claim 7 wherein each middle rail is located equidistant between the leading edge rail, the trailing edge rail and any other middle rail.

9. The computer chassis of claim 7, wherein the slot filler comprises at least three of the middle rails.

10. The computer chassis of claim 9 wherein each middle rail is located equidistant between the leading edge rail, the trailing edge rail and any other middle rail.

11. A computer memory module slot filler, comprising:
a memory slot interface configured for insertion into a first memory module slot disposed on a motherboard, the motherboard comprising:
   a first memory port disposed on the motherboard and including the first memory module slot; and
   a second memory port disposed on the motherboard and including a second memory module slot, wherein the first and second memory module slots include respective first ends and second ends, and wherein the motherboard is configured to be included in a computer chassis, the computer chassis further comprising a cooling fan operable to direct airflow toward the first ends of the first memory module slot and the second memory module slot respectively;
a body coupled to the memory slot interface and that is defined by a set of exterior dimensions, the body comprising a leading edge rail that protrudes from the first end of the memory module slot in a first direction by a first dimension, and wherein the leading edge rail has a second dimension in a second direction, transverse to the first direction, and wherein the set of exterior dimensions include:
   a first subset of one or more exterior dimensions matching corresponding exterior dimensions of a memory module inserted in the second memory module slot disposed on the motherboard, wherein the memory module comprises a substrate and a plurality of memory chips mounted on the substrate and the memory module is operable to be inserted into the second memory module slot of the motherboard such that the memory module is communicatively coupled to the motherboard, and wherein the first subset includes the first dimension and the second dimension of the leading edge rail; and
   a second subset of one or more exterior dimensions that are smaller than corresponding exterior dimensions of the memory module substrate; and
wherein the slot filler is monolithic and comprises one of a plastic material, a polymer material, or a rubber material.

12. The computer memory module slot filler of claim 11, further comprising a trailing edge rail that protrudes from a second end of the memory module slot in the first direction, wherein at least a portion of a region between the leading edge and the trailing edge of the slot filler is void of material.

13. The computer memory module slot filler of claim 12, further comprising a top rail extending between the leading edge and trailing edge.

14. The computer memory module slot filler of claim 13, further comprising a middle rail that protrudes from the memory slot interface to the top rail at a location between the leading edge rail and the trailing edge rail.

15. The computer memory module slot filler of claim 14, wherein each middle rail is located equidistant between the leading edge rail, the trailing edge rail and any other middle rail.

16. The computer memory module slot filler of claim 14, wherein the slot filler comprises at least two of the middle rails.

17. The computer memory module slot filler of claim 16, wherein each middle rail is located equidistant between the leading edge rail, the trailing edge rail and any other middle rail.

18. The computer memory module slot filler of claim 16, wherein the slot filler comprises at least three of the middle rails.

19. The computer memory module slot filler of claim 18, wherein each middle rail is located equidistant between the leading edge rail, the trailing edge rail and any other middle rail.

20. The computer memory module slot filler of claim 11, wherein the memory module is a dual in-line memory module (DIMM).

* * * * *